US012684726B2

(12) United States Patent
Ewald

(10) Patent No.: US 12,684,726 B2
(45) Date of Patent: Jul. 14, 2026

(54) INVERTER STRUCTURE OF AN INVERTER OF A POWER ELECTRONICS MODULE FOR OPERATING AN ELECTRIC DRIVE OF A MOTOR VEHICLE

(71) Applicant: ZF Friedrichshafen AG, Friedrichshafen (DE)

(72) Inventor: Ake Ewald, Bayreuth (DE)

(73) Assignee: Friedrichshafen AG, Friedrichshafen (DE)

( * ) Notice: Subject to any disclaimer, the term of this patent is extended or adjusted under 35 U.S.C. 154(b) by 395 days.

(21) Appl. No.: 18/365,826

(22) Filed: Aug. 4, 2023

(65) Prior Publication Data

US 2024/0049417 A1 Feb. 8, 2024

(30) Foreign Application Priority Data

Aug. 4, 2022 (DE) .......................... 102022208100.5

(51) Int. Cl.
| | |
|---|---|
| *H05K 7/14* | (2006.01) |
| *H02M 7/00* | (2006.01) |
| *H05K 7/20* | (2006.01) |

(52) U.S. Cl.
CPC ........ *H05K 7/14329* (2022.08); *H02M 7/003* (2013.01); *H05K 7/14322* (2022.08); *H05K 7/209* (2013.01)

(58) Field of Classification Search
CPC ...... H02M 7/003; H02M 7/5387; H02M 7/42; H02M 7/48; H02M 7/53871;
(Continued)

(56) References Cited

U.S. PATENT DOCUMENTS

| | | | | |
|---|---|---|---|---|
| 2010/0302733 A1* | 12/2010 | Woody | ............... | H05K 7/20927 |
| | | | | 361/689 |
| 2019/0296657 A1* | 9/2019 | Chung | .............. | H02M 7/53875 |

FOREIGN PATENT DOCUMENTS

| | | |
|---|---|---|
| DE | 10 2011 088 250 A1 | 6/2013 |
| DE | 10 2015 213 164 A1 | 1/2017 |

(Continued)

OTHER PUBLICATIONS

Office Action dated May 12, 2023 for German Patent Application No. 10 2022 208 100.5 (14 pp.), note: pp. 1 and 2 are English language Explanations to Section C. Result of Determination Document.

*Primary Examiner* — Bryan R Perez
(74) *Attorney, Agent, or Firm* — Crowell & Moring LLP

(57) ABSTRACT

An inverter includes a heat sink having a cooling plate, and at least one phase, wherein each phase includes a half-bridge arranged on an upper side of the cooling plate and DC and AC busbars stacked on the half-bridge and electrically insulated from one another, wherein taps of the DC and AC busbars are provided on mutually opposite sides of the power electronics module. A first conduction element including a thermally conductive material is arranged on the side of the DC busbars and between the DC busbars and the cooling plate and is conductively connected to the DC busbar closer to the cooling plate, and/or a second conduction element comprising a thermally conductive material arranged on the side of the AC busbar and between the AC busbar and the cooling plate and is conductively connected to the AC busbar and the cooling plate.

9 Claims, 3 Drawing Sheets

(58) Field of Classification Search
CPC ...... H02M 7/5395; H02M 1/327; H02M 1/00;
H05K 7/20927; H05K 7/14329; H05K
7/209; H05K 7/1432; H05K 7/14322;
H05K 7/2039; H05K 7/20872; H05K
7/20981; H05K 7/20336; H05K 7/20936
See application file for complete search history.

(56) References Cited

FOREIGN PATENT DOCUMENTS

| DE | 10 2018 111 630 A1 | 11/2019 |
| DE | 10 2020 133 190 A1 | 6/2022 |

* cited by examiner

INVERTER STRUCTURE OF AN INVERTER OF A POWER ELECTRONICS MODULE FOR OPERATING AN ELECTRIC DRIVE OF A MOTOR VEHICLE

CROSS-REFERENCE TO RELATED APPLICATION

This application claims priority to German Application No. DE 10 2022 208 100.5, filed on Aug. 4, 2022, the entirety of which is hereby fully incorporated by reference herein.

FIELD

The present invention relates to the field of electromobility, in particular of electronics modules for an electric drive.

BACKGROUND AND SUMMARY

The use of electronics modules, for example power electronics modules, in motor vehicles has increased significantly in recent decades. This can be attributed firstly to the need to improve the fuel saving and the vehicle performance and secondly to the advances in semiconductor technology. A prominent example of such electronics modules are inverters which serve the purpose of supplying a polyphase alternating current to electric machines such as electric motors or generators. In this case, a direct current generated by means of a DC energy source, for example a battery, is converted into a polyphase alternating current. For this purpose, the electronics modules comprise a multiplicity of electronics component parts with which bridge circuits (for example half-bridges) are realized, for example semiconductor power switches, which are also referred to as power semiconductors.

In previously known arrangements of inverters, power semiconductors, i.e. semiconductor power switches in the form of high-side switches HS or low-side switches LS which together form a half-bridge, are arranged one behind the other starting from the DC-link capacitor. That is to say that they are not arranged next to one another but rather are positioned opposite one another with their electrical contact terminals at which the alternating current is taken, with the result that, for example, the electrical contact terminal of the HS is closer to the DC link than that of the LS.

Inverters in automotive construction need to be adapted to different power classes in the vehicle. This results in different currents needing to be provided by the inverter. In many cases it is not sensible for economic reasons to design an adapted module with the associated power electronics for each power class. For this reason, either discrete power switches or a plurality of power modules are used in parallel in order to achieve the required power class. For example, a plurality of half-bridges, for example four per electrical phase, are arranged next to one another, with the result that the inverter becomes in total twelve half-bridges "long".

In order to carry the required currents, the busbars need to be cooled. For this purpose, the busbars have large dimensions. Also, for additional cooling, a thermal link to the housing of the inverter can be provided. Since there is still a need for improvement here, however, the invention is therefore based on the object of providing improved cooling of the busbars.

This object is achieved by an inverter structure of an inverter of a power electronics module and the use thereof in a motor vehicle in accordance with the present disclosure. Advantageous configurations are also the subject matter of the present disclosure.

What is proposed is an inverter structure of an inverter of a power electronics module for operating an electric drive of a motor vehicle, having a heat sink having a cooling plate, and at least one phase, wherein per phase there is provided: at least one half-bridge arranged on an upper side of the cooling plate, and DC and AC busbars, which are stacked one on top of the other on the at least one half-bridge and are electrically insulated from one another by insulation elements, wherein taps of the DC busbars and the AC busbar are provided on mutually opposite sides of the power electronics module. Also provided is: at least one first conduction element consisting of a thermally conductive material which is arranged on the side of the DC busbars and between said DC busbars and the cooling plate and is conductively connected to the DC busbar which is closer to the cooling plate and the cooling plate, and/or at least one second conduction element consisting of a thermally conductive material which is arranged on the side of the AC busbar and between said AC busbar and the cooling plate and is conductively connected to the AC busbar and the cooling plate.

In one embodiment, the conduction element is formed integrally from the cooling plate or is formed as a separate component part and is thermally conductively connected to the cooling plate.

In one embodiment, an electrically insulating heat-conducting material is provided on the upper side of the conduction element which is conductively connected to the busbar.

In one embodiment, the busbar has an electrically insulating insulation element in a region at which it is conductively connected to the upper side of the conduction element.

In one embodiment, a frame in the form of an electrically insulating insulation element is arranged above the uppermost busbar and is designed to act as fixing and positioning of the busbars and the conduction elements.

In addition, the use of an inverter structure of an inverter in a power electronics module for driving an electric drive of a motor vehicle equipped with an electric drive is proposed.

In addition, a power electronics module having an inverter having the described inverter structure is proposed. Likewise, an electric drive, in particular electrical axle drive, for a motor vehicle having at least one electric machine, a gear device and the power electronics module as well as a motor vehicle having the electric drive are proposed.

Further features and advantages of the invention can be gleaned from the description below of exemplary embodiments of the invention, with reference to the figures in the drawing which shows details according to the invention, and from the claims. The individual features can be implemented in each case individually or together in any desired combination in one variant of the invention.

Preferred embodiments of the invention are explained in more detail below with reference to the attached drawings.

DETAILED DESCRIPTION

Figure 1:
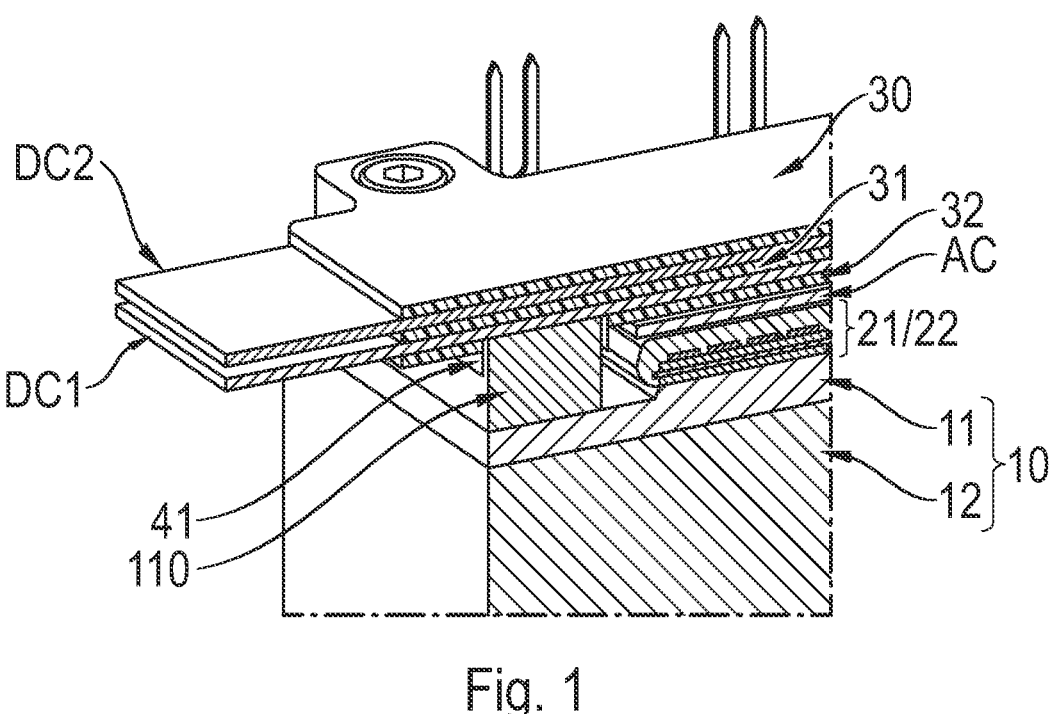
FIG. 1 shows an angled view of a power electronics module from the DC side in accordance with one embodiment of the present invention.

In the description of the figures below, identical elements or functions are provided with the same reference signs.

In previous inverters 1, the busbars DC1, DC2 and AC, which lead from the DC-link capacitor to the modules and lead away in the AC direction, are not actively/conductively cooled, with the result that they need to be dimensioned generously in order to carry the required currents. Furthermore, the cooling of the busbars DC1, DC2 and AC takes place via the housing of the inverter when they are subjected to too much thermal loading. This applies specifically to the continuous power of the inverter 1. Therefore, it is an aim of the present disclosure, as has already been mentioned at the outset, to provide improved cooling of the busbars DC1, DC2 and AC.

Firstly, the principal design of the power electronics module 100 will be described with reference to FIGS. 1 to 4. The power electronics module 100 has a heat sink 10, which has at least one cooling plate 11. The housing 12 illustrated in the figures is used in the embodiment shown to accommodate the cooling plate 11 and to conduct the coolant. The cooling plate 11 can be provided individually for each phase in the case of a plurality of interconnected power electronics modules 100 (a plurality of phases) or can be formed as a cooling plate 11 extending over all of the phases (as in the case of the B6 module).

Figure 3:
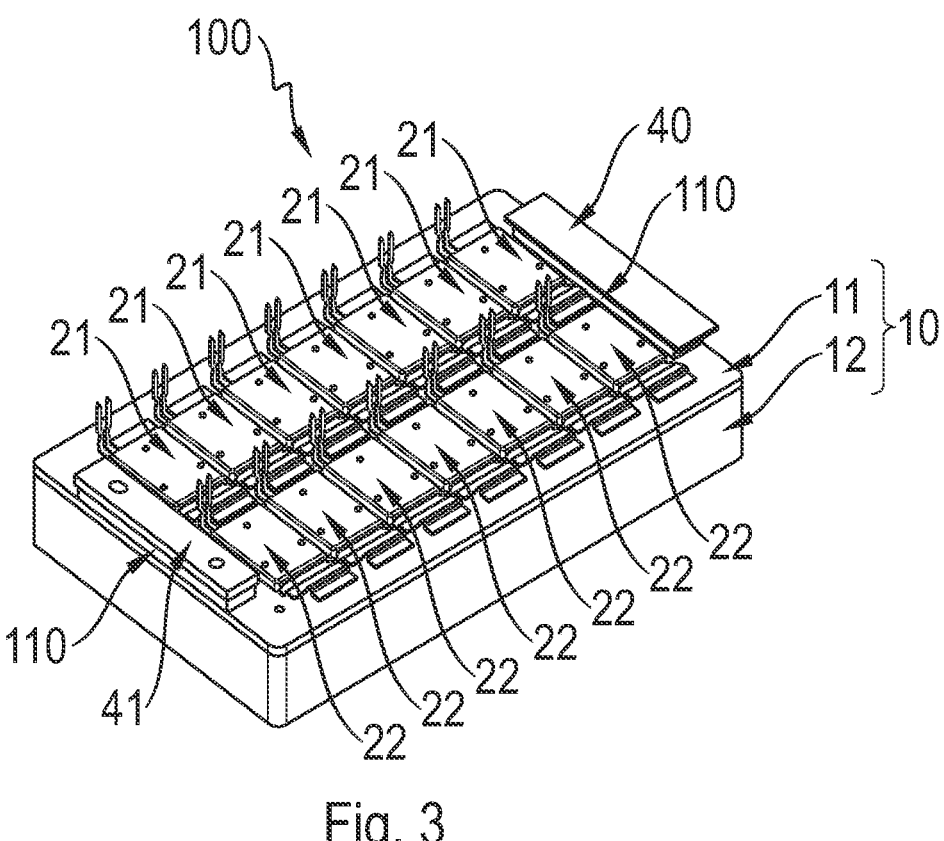
FIG. 3 shows a plan view of a power electronics module without busbars in accordance with one embodiment of the present invention.

At least one half-bridge 20 having associated power semiconductors (high-side switches 21 or low-side switches 22), which in this embodiment are connected in parallel, is provided on the upper side of the cooling plate 11, as is shown in FIG. 3. The arrangement of the power semiconductors is, however, not restricted to the embodiment shown. Instead, the power semiconductors can also be arranged in another order, depending on the embodiment.

DC busbars DC1, DC2 (DC negative and DC positive) and an AC busbar AC are arranged stacked one on top of the other above the half-bridges 20 and connected to the associated contacts thereof, as can be seen in particular in FIG. 1. In this case, either the DC negative busbar can be arranged beneath the DC positive busbar or the other way around, depending on the application.

As can be seen in FIG. 1, the busbars DC1, DC2 and AC are electrically insulated from one another by insulation elements 30-32. The insulation elements 30-32 are generally formed from a plastic which does not have particularly good thermal conductivity.

Figure 4:
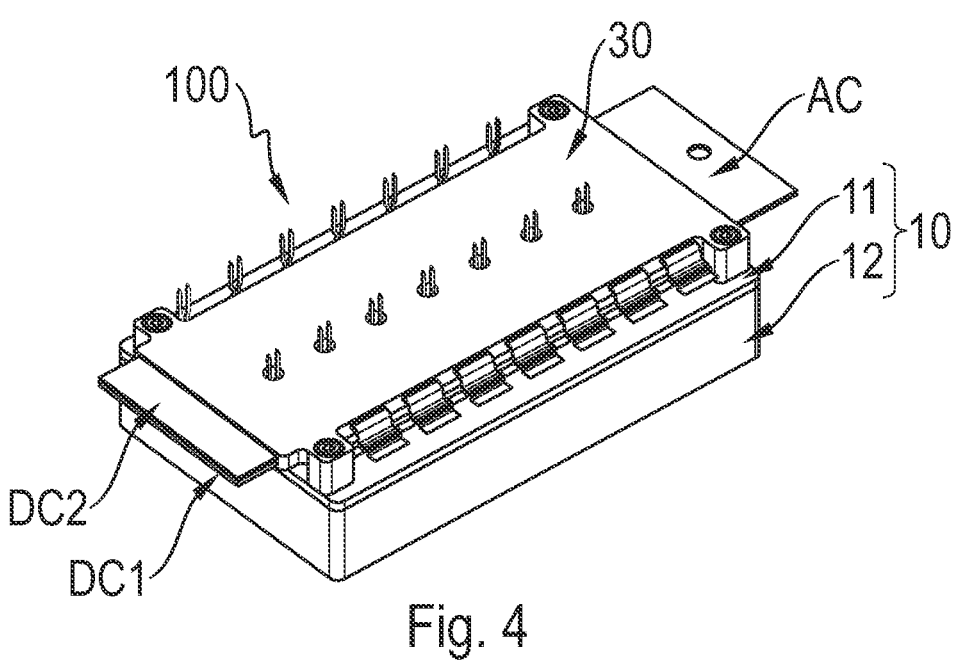
FIG. 4 shows a plan view of a power electronics module having busbars in accordance with one embodiment of the present invention.

The taps of the DC busbars DC1, DC2 point towards a different side of the power electronics module 100 than the taps of the AC busbar AC, as can be seen in the figures (in particular FIG. 4). The taps are advantageously positioned on mutually opposite sides of the power electronics module 100.

Figure 2:
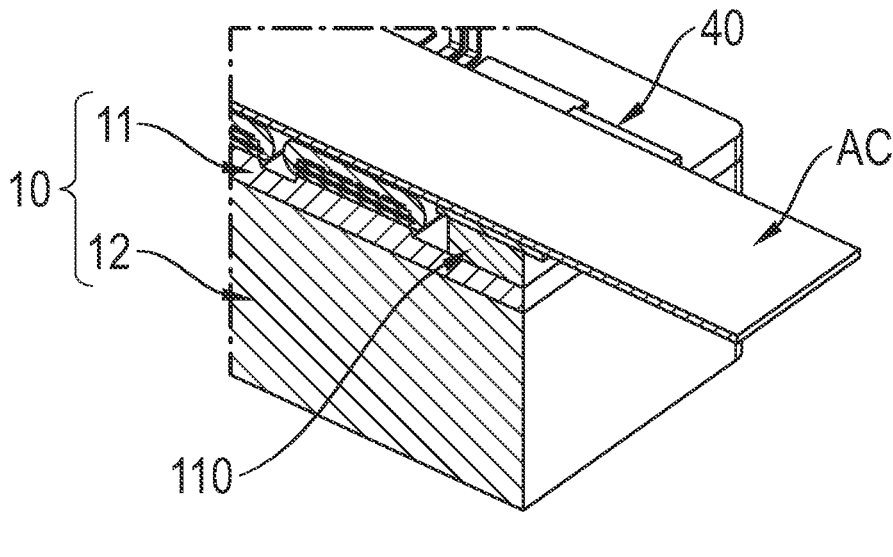
FIG. 2 shows an angled view of a power electronics module from the AC side in accordance with one embodiment of the present invention.

In each case one conduction element 110 is provided on a region between the upper side of the cooling plate 11 and the lowermost DC busbar DC1 on the DC side and/or the AC busbar AC on the AC side, which region is not populated by the half-bridges 10 or other component parts, as can be seen in FIGS. 1 and 2. Said conduction element 110 is formed from a material with good thermal conductivity (more conductive than the plastic of the insulation elements 30-32) such as copper or aluminum. The conduction element 110 can be formed integrally from the cooling plate 11 or can be connected as a separate conduction element 110 on the cooling plate 11, for example by means of gap pads, gap fillers, pressing, welding or similar methods.

In one embodiment, the busbars DC1, AC are not surrounded in the region of the conduction element 110 by an insulation element 32. In this case, an electrically insulating heat-conducting material 40, 41 is provided between the busbar DC1, AC and the conduction element 110. If the insulation element 32 has a sufficient thermal conductivity, the insulation element 32 can also be used as heat-conducting material 40, 41.

The conductive line into the cooling plate 11 in order to cool the AC busbar AC is realized by the conduction element 110 beneath the AC busbar AC on the AC side (FIG. 2) with the aid of an electrically insulating heat-conducting material 40 such as a gap pad (shown in FIG. 2) or an insulating film having a gap filler.

On the DC side (FIG. 1), direct conductive cooling of the lowermost DC busbar DC1 is likewise realized with the aid of an electrically insulating heat-conducting material 41. In this case too, a gap pad or an insulating film (shown in FIG. 1) having a gap filler can be used. The insulating film is in this case advantageously arranged not only on the upper side of the conduction element 110 but also surrounds said conduction element 110 on the side regions thereof, as can be seen in FIG. 3, and to such an extent that it is ensured that it is not possible for there to be any electrical contact between the conduction element 110 and the cooling plate 11. In addition, owing to the composite structure comprising the DC busbars DC1, DC2, good, areal, indirect cooling of the DC busbar DC2 can be realized by the insulation plane (insulation element 32) between the DC busbars DC1, DC2.

In an alternative embodiment, the insulation element 32, which is generally a molding compound, can also act as electrical insulation, with the result that there is no need to use heat-conducting material 40, 41.

Owing to the positioning of the conduction elements 110 above the cooling plate 11, the heat path up to the cooling structure (the cooling plate 11) is in any case markedly better than in the case of cooling at the housing of the inverter 1, which can only realize a very indirect cooling path to the coolant.

Advantageously, that DC busbar DC1 or DC2 which has a poorer thermal connection within the power electronics module 100 (this can be determined via the internal design of the power electronics module 100) is conductively connected directly to the conduction element 110. In the embodiment shown, this is the DC busbar DC1.

Owing to the conductive cooling on the DC side, very good heat removal from the DC-link capacitor, which generally directly adjoins the power electronics module 100 on the DC side, is also made possible.

An uppermost insulation element 30, which acts at the same time as a frame, as shown in FIG. 4, for fixing the busbars DC1, DC2, AC, can also act as a downholder in order to enable improved contact-making with the busbars AC and DC1 (in this embodiment). In the process it enables the positioning of the busbars DC1, DC2, AC and the conductive cooling links (conduction elements 110 and heat-conducting material 40,41) in relation to one another. Advantageously, the insulation element 30 is fastened on the cooling plate 11 by means of screws via domes reaching from the upper side of the insulation element 30 up to the cooling plate 11.

The high-side switches 21 or low-side switches 22 of the half-bridges 20 comprise one or more power semiconductor component parts, such as IGBTs or MOSFETs. The bridge circuit formed from the half-bridges 20 can be applied to a printed circuit board, with the result that the power switches can be electrically connected and/or connected in terms of signal technology to a control device such as an electronic control unit (ECU) of the motor vehicle 200 by means of electrical contacts provided on the population side of the printed circuit board. The control device is therefore capable of driving the power switches 21 or 22 for the purpose of operating the electric drive, in particular for the purpose of supplying current to the electric machine, of a motor vehicle 200 equipped with a corresponding drive. The printed circuit board can comprise a printed circuit board (PCB) or a flexible printed circuit board.

An embodiment of a design of a power electronics module 100 having one phase and seven half-bridges 20 is illustrated in the figures in order to illustrate a principle of the present disclosure. However, it is also possible for a plurality of phases to be provided, for example two or three or a multiple thereof, for example six, nine, twelve, etc. It is also possible for a B6 module to be realized. It is also possible for more or fewer half-bridges 20 to be provided.

In addition, various power semiconductors can be used, for example Si-IGBTs, SiC-MOSFETs, SiC cascodes, GaNs. It is likewise possible for a plurality of different semiconductor types to be used simultaneously within the power electronics module 100, for example Si-IGBTs and SiC-MOSFETs.

The illustrated power electronics module 100 has one semiconductor module per electrical phase. Each semiconductor module has at least one half-bridge 20, which is formed from in each case one high-side switch 21, with which electrical contact can be made on both sides, and one low-side switch 22, which is arranged parallel thereto and is connected in parallel therewith and with which electrical contact can be made on both sides. The DC power supply takes place for each phase via the DC busbars DC1 and DC2 from one side of the power switches 21 and 22, respectively (from the left-hand side in FIG. 4). The alternating current generated is collected via an AC busbar AC on the other side of the power switches 21 and 22, respectively (on the right-hand side in FIG. 4).

Figure 5:
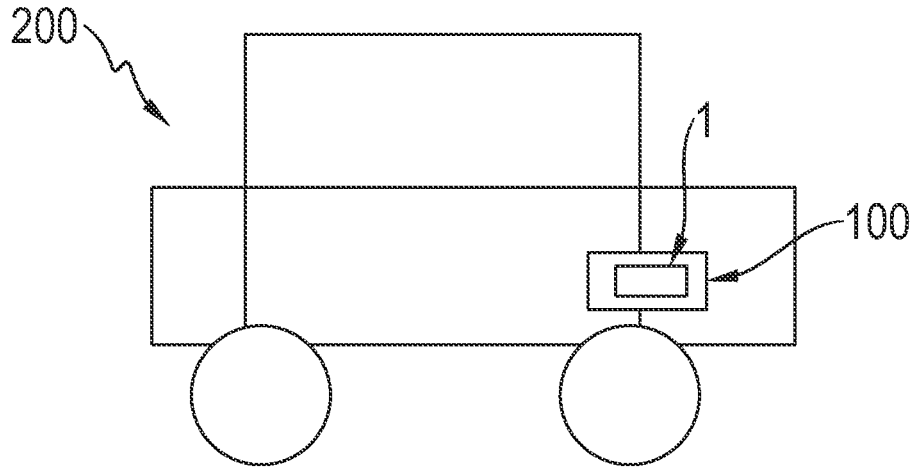
FIG. 5 shows a motor vehicle having an inverter and a power electronics module in accordance with one embodiment of the present invention.

A power electronics module 100 within the scope of the present disclosure serves to operate an electric motor of a motor vehicle 200 driven by means of a rechargeable battery or fuel cell, as is indicated in FIG. 5. The motor vehicle 200 is in particular a utility vehicle, such as an HGV or a bus, or a passenger car. The power electronics module 100 comprises an inverter 1. It can also comprise a rectifier, a DC/DC converter, a transformer and/or another electrical converter or part of such a converter or can be a part thereof. In particular, the power electronics module 100 is used for supplying current to an electric machine, for example an electric motor and/or a generator. An inverter is preferably used to generate a polyphase alternating current from a direct current generated by means of a DC voltage of an energy source, for example a battery. A DC/DC converter is used, for example, to convert (step up) a direct current coming from a fuel cell into a direct current that can be used by the drive.

DC/DC converters and inverters 1 for electric drives of motor vehicles 200, in particular passenger cars and utility vehicles, as well as buses, are designed for the high-voltage range and are designed in particular in a blocking voltage class of above approximately 650 volts.

The described inverter arrangement is used, for example, in motor vehicles 200. The motor vehicle 200 can in particular have an electrically driven axle. The motor vehicle 200 can in principle be in the form of a purely internal combustion engine-based motor vehicle 200, a hybrid motor vehicle or an electric vehicle.

LIST OF REFERENCE SIGNS

1 inverter
100 power electronics module
200 motor vehicle
DC1, DC2 DC busbars
AC AC busbar
10 heat sink
11 upper side/cooling plate
110 conductive conduction element
12 housing
20 half-bridge
21 high-side switch (HS)
12 low-side switch (LS)
30-32 insulation elements busbars
40, 41 heat-conducting material

The invention claimed is:

1. An inverter of a power electronics module for operating an electric drive of a motor vehicle, the inverter comprising:
a heat sink comprising a cooling plate; and
at least one phase, wherein each phase of the at least one phase comprises:
at least one half-bridge arranged on an upper side of the cooling plate; and
DC and AC busbars, which are stacked one on top of the other on the at least one half-bridge and are electrically insulated from one another by insulation elements, wherein taps of the DC busbars and the AC busbar are provided on mutually opposite sides of the power electronics module;
at least one first conduction element comprising a solid thermally conductive material which is arranged on a side of the DC busbars and between said DC busbars and the cooling plate, and the at least one first conduction element is conductively connected to the cooling plate and connected to the DC busbar which is closer to the cooling plate, and/or
at least one second conduction element comprising a solid thermally conductive material which is arranged on a side of the AC busbar and between said AC busbar and the cooling plate and is conductively connected to the AC busbar and the cooling plate.

2. The inverter according to claim 1, wherein the conduction element is formed integrally from the cooling plate.

3. The inverter according to claim 1, wherein the conduction element is formed as a separate component part and is thermally conductively connected to the cooling plate.

4. The inverter according to claim 1, comprising:
an electrically insulating heat-conducting material provided on an upper side of the conduction element which is conductively connected to the busbar.

5. The inverter according to claim 1, wherein the busbar comprises an electrically insulating insulation element in a region at which it is conductively connected to an upper side of the conduction element.

6. The inverter according to claim 1, comprising a frame in the form of an electrically insulating insulation element arranged above an uppermost busbar and is designed to act as fixing and positioning of the busbars and the conduction elements.

7. A power electronics module comprising the inverter according to claim 1.

8. An electric drive for a motor vehicle comprising:

at least one electric machine;

a gear device; and the power electronics module according to claim 7.

9. A motor vehicle, comprising the electric drive according to claim 8.

\* \* \* \* \*